United States Patent
Li et al.

(10) Patent No.: US 12,289,042 B2
(45) Date of Patent: Apr. 29, 2025

(54) METHOD AND APPARATUS FOR STABLE BATTERY-POWERED SUPPLY MODULES

(71) Applicant: Avago Technologies International Sales Pte. Limited, Singapore (SG)

(72) Inventors: Shengyuan Li, Irvine, CA (US); Xicheng Jiang, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 250 days.

(21) Appl. No.: 18/114,133

(22) Filed: Feb. 24, 2023

(65) Prior Publication Data

US 2024/0291372 A1    Aug. 29, 2024

(51) Int. Cl.
| | |
|---|---|
| *H02M 3/157* | (2006.01) |
| *H02M 1/00* | (2006.01) |
| *H03K 7/06* | (2006.01) |
| *H05B 45/335* | (2020.01) |
| *H05B 45/34* | (2020.01) |
| *H05B 45/345* | (2020.01) |

(52) U.S. Cl.
CPC ......... *H02M 1/0045* (2021.05); *H02M 3/157* (2013.01); *H03K 7/06* (2013.01); *H05B 45/335* (2020.01); *H05B 45/34* (2020.01); *H05B 45/345* (2020.01)

(58) Field of Classification Search
CPC ...... H02M 3/157; H02M 1/0045; H03K 7/06; H05B 45/335; H05B 45/34; H05B 45/345
See application file for complete search history.

(56) References Cited

U.S. PATENT DOCUMENTS

| | | | |
|---|---|---|---|
| 2011/0221407 A1* | 9/2011 | Kato | H02M 3/158 323/271 |
| 2012/0217946 A1* | 8/2012 | Ju | H02M 3/156 323/285 |
| 2012/0223691 A1 | 9/2012 | Weinstein et al. | |
| 2019/0157975 A1* | 5/2019 | Vanin | H03K 7/08 |
| 2020/0127566 A1 | 4/2020 | Lazaro et al. | |
| 2023/0108239 A1* | 4/2023 | Ozalevli | H02M 3/158 323/271 |

FOREIGN PATENT DOCUMENTS

EP    2 879 264 A2    6/2015

OTHER PUBLICATIONS

European Search Report on non-Foley case related to U.S. Appl. No. 18/114,133 DTD Jul. 25, 2024.

* cited by examiner

*Primary Examiner* — Harry R Behm
(74) *Attorney, Agent, or Firm* — Foley & Lardner LLP

(57) ABSTRACT

A system includes a voltage booster circuit to receive an input voltage and provide an output voltage. A first device that is coupled to the voltage booster circuit to receive a digitized input voltage and a digitized output voltage and to determine, based on the digitized input voltage and the digitized output voltage, a first threshold level for the voltage booster circuit to operate in a pulse frequency modulation (PFM) mode. A second device that is coupled to the voltage booster circuit to receive the input voltage and the output voltage and to determine a second threshold level for the voltage booster circuit to operate in the PFM mode. A selector device that is coupled to the first device and the second device to select one of the first threshold level or the second threshold level for the voltage booster circuit.

20 Claims, 3 Drawing Sheets

METHOD AND APPARATUS FOR STABLE BATTERY-POWERED SUPPLY MODULES

The present description relates generally to power supplies and, in particular, to battery-powered power supplies requiring stable output voltage.

BACKGROUND

A switching power supply generates a voltage pulse to produce a current that charges a capacitor. By charging the capacitor and maintaining the charge, a stable power supply with stable output voltage is produced. The power supply may drive different circuits or may operate at different conditions that may require different output currents. A width of the voltage pulses may be widened or made narrow to accommodate for varying output current and, thus, a pulse width modulation (PWM) arrangement may be used. In the PWM arrangement, the frequency of the pulses does not change. When the output load, e.g., current, increases, the width of the pulses get wider and when the output load decreases, the width of the pulses get narrower. When the output load is further decreased, e.g., beyond a predetermined threshold, the PWM arrangement may not work in a desired manner and the pulses may not become narrower.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

Figure 1:
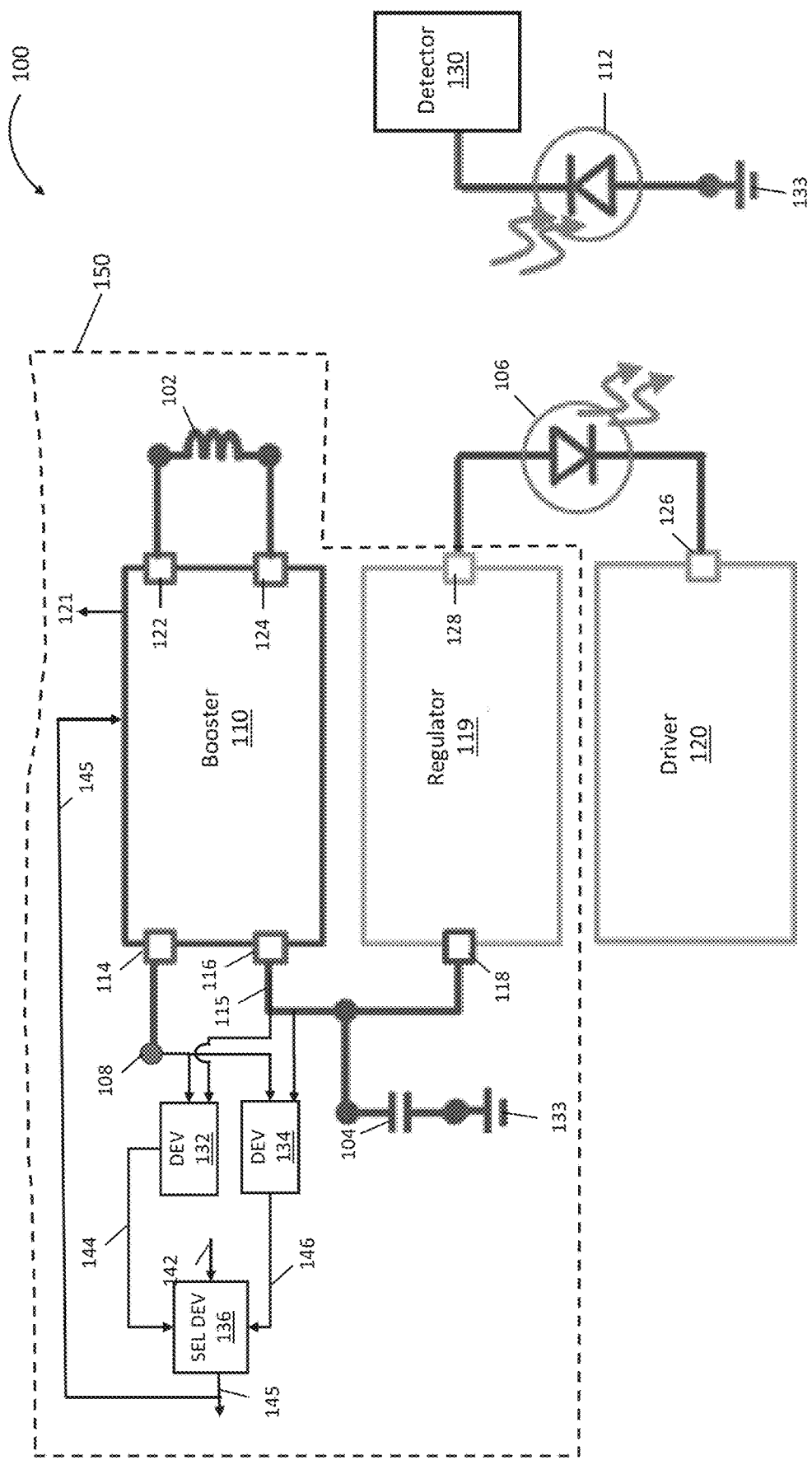
FIG. 1 illustrates a system with a stable power supply for driving a light emitting diode to generate light pulses and a detection system using a photo detector, according to various aspects of the subject technology.

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

In some embodiments, a switching power supply is used in a device such as a wearable device that is incorporated into clothing or is worn on the body such as a smartwatch, a fitness tracker, or smart glasses. In some embodiments, the switching power supply is used in a cell phone or another mobile device. In some embodiments, the switching power supply receives power from a battery and uses a booster circuit to increase the voltage of the battery to a voltage level that may be needed for the device.

The switching power supply may drive different circuits or devices or may operate at different conditions. Thus, the switching power supply may require different output currents. A width of the voltage pulses may be widened or made narrow to adjust for various output currents. Therefore, the switching power supply may be arranged to operate in the PWM mode. As the condition changes and a lower power usage is required from the switching power supply, the width of the PWM pulses get narrower and when a higher power usage is required from the switching power supply, the width of the PWM pulses get wider and more power is drawn from the battery coupled to the switching power supply. When the switching power supply operates in the PWM mode, the frequency of the pulses may not change while the width of the pulses change.

In some embodiments, when a low amount of power is drawn from the switching power supply, e.g., when the circuit or device fed by the switching power supply is in standby mode, the switching power supply may provide less power such that PWM mode may not work and the frequency of the pulses may be reduced to reduce the power produced by the switching power supply and the switching power supply may work in the pulse frequency modulation (PFM) mode. Thus, it is determined that the switching power supply is required to work in the PWM mode or the PFM mode. Additionally, when the switching power supply starts operating, the switching power supply may start in the PFM mode and it may be determined when to switch to the PWM mode and what the threshold voltage or current, a PFM threshold level, of the switching power supply may be to switch from the PWM mode to the PFM mode. Thus, for low output loads, a pulse frequency modulation (PFM) arrangement is used such that the width of the pulses do not change. However, the frequency of the pulses change. For example, the frequency of the pulses is reduced with the low output load and vice versa. In some embodiments, the booster circuit provides an output voltage that is greater than the input voltage and, thus, the booster circuit is used for increasing the voltage.

In some embodiments, the threshold voltage of the PFM mode is determined, e.g., calculated using the input voltage and output voltage of the booster circuit. In some embodiments, the PFM threshold level is calculated using digitized values of the input voltage and output voltage of the booster circuit. Because at the beginning of using the switching power supply, there is not enough power generated by the switching power supply to operate the ADCs to calculate the digitized values of the input voltage and output voltage of the booster circuit, the calculated PFM threshold level may not be reliable. In some embodiments, a device, e.g., a circuit, and a method is introduced that does not use digitized voltages for determining the PFM threshold level but instead an electronic circuit is used, coupled to the booster circuit, that based on the input voltage and the output voltage of the booster circuit provides an output voltage as the PFM threshold level, e.g., a PFM threshold voltage.

FIG. 1 illustrates a system 100 with a stable power supply 150 for driving a light emitting diode (LED) 106 to generate light pulses and a detection system 130$m$ using a photo detector 112, according to various aspects of the subject technology. FIG. 1 shows a booster circuit 110, e.g., a voltage booster circuit, that receives an input voltage 108 at an input node 114, e.g., an input port, and provides an output voltage 115 at an output node 116, e.g., an output port. The booster circuit 110, e.g., the circuit, provides the input voltage 108, and the output voltage 115, e.g., a booster output voltage, to a first device 132 and a second device 134. In some embodiments, the first device 132 includes an analog to digital converter (ADC) for each input such that the input voltage 108 of the booster circuit 110 and the output voltage 115 of the booster circuit 110 are digitized in the first device 132 and the digitized output voltages are used by other components of the first device 132. Thus, the first device 132 uses the digitized output voltage and the digitized input voltage to determine, e.g., calculate, a first threshold level, e.g., a current and/or voltage threshold, for the voltage booster circuit to operate in the PFM mode, e.g., mode. In some embodiments, when the output voltage is below the first threshold level, e.g., a first PFM threshold level, booster circuit 110 works in the PFM mode and used the PFM arrangement. In some embodiments, in the PFM mode the frequency of the pulses are modified by up to 75 percent and in the PWM mode, e.g., mode, the width of the pulses are modified by up to 50 percent. In some embodiments, the booster circuit 110 provides the triggering signal 121. In some embodiments, in response to the booster circuit 110 receiving the input voltage 108, e.g., a positive voltage, the booster circuit 110 provides the triggering signal 121 that changes from zero volts to a positive voltage and, thus, triggering the timer 138.

In some embodiments, the first device 132, in addition to using the input voltage 108 of the booster circuit 110 and the output voltage 115 of the booster circuit 110 that are digitized, also uses a predetermined current as a booster output current of the booster circuit 110 when calculating the first threshold level. In some embodiments, the predetermined current is between 100 milliamperes (mA) and 200 mA. In some embodiments, a battery is coupled to the input node 114 of the booster circuit 110. In some embodiments, the output voltage 115 is greater than the input voltage 108. In some embodiments, the input voltage 108 of the booster circuit 110 and the output voltage 115 of the booster circuit 110 are digitized using the same number of quantization levels and the same number of bits. In some embodiments, the booster circuit 110 is a switched-mode power supply cable of generating an output voltage higher than the input voltage, by storing energy in an inductor and releasing it to the load via charging a capacitor. The value of the output voltage may be controlled by a duty-cycle of a control signal that defines the relative timing for storing energy in the inductor and releasing the stored energy to the charge the capacitor.

In some embodiments, when the power supply is initially powered up, the ADCs of the first device 132 do not have enough time to digitize the input voltage 108 and/or the output voltage 115 and, thus, the calculated first threshold level is incorrect. In some embodiments, as shown, the output node 116 of the booster circuit 110 is coupled to a regulator 119, e.g., a voltage regulator or a linear drop-out (LDO) voltage regulator, and the regulator 119 draws a large current of between 50 mA and 100 mA. Therefore, even at the initial power up, when the input voltage 108 of the booster circuit 110 and the output voltage 115 of the booster circuit 110 that are not digitized yet, the booster circuit 110 may be in the PFM mode and little capacitance may be used, however, because of the current drawn by the regulator 119, the booster circuit 110 is in the PWM mode and not enough capacitance is activated and the output voltage 115 of the booster circuit 110 may show instability and ringing. In some embodiments, the regulator 119 receives a voltage and a current from the booster circuit 110 and generates a stable current and voltage at an output of the regulator 119. The LDO voltage regulator may operate at a very low difference between input and output voltages of the LDO voltage regulator.

As shown, a capacitor 104 is coupled at the output node 116 the booster circuit 110 and a ground 133. A capacitance value of the capacitor 104 is determined, e.g., designed, to reduce the ripples, e.g., fluctuations, of the output voltage 115 of the booster circuit 110. As shown, the output node 116 the booster circuit 110 is coupled to an input node 118, e.g., an input port, of the regulator 119. In some embodiments, the capacitor 104 shows lower impedance for the fluctuations when the frequency of the fluctuation increase and provides a bypass direction for the high frequency fluctuations to the ground 133 and causes the signal to noise ratio (SNR) of the input current of the regulator 119 to increase. The regulator 119 is used to further smooth the output voltage 115 of the booster circuit and provide a stable voltage at an output node 128 of the regulator 119. As shown a LED is coupled between the output node 128 of the regulator 119 and an input node 126 of a driver circuit 120 to provide, e.g., to draw, the current for the LED 106 such that the LED 106 generates a light intensity. In some embodiments, the ripples are the fluctuations of the output voltage 115 that are generated by charging and discharging of a capacitor, e.g., the capacitor 104. In some embodiments, the fluctuations of the output voltage 115 are unwanted and are considered as noise that generates light intensity fluctuations, e.g., a light intensity noise, in the light intensity generated by the LED coupled to the output voltage 115. In some embodiments, the capacitor 104 acts as a filter and removes or reduces the fluctuations of the of the output voltage 115. In some embodiments, the regulator 119 removes or reduces the fluctuations of the of the output voltage 115 and provides a stable current for the LED 106 such that the LED 106 generates the light intensity without fluctuations. In some embodiments, the capacitor 104 increases the SNR of the current passing through the LED 106.

In some embodiments, an inductor 102 is connected between a first node 122 and a second node 124 of the booster circuit 110. In some embodiments, the inductor 102 is externally connected, e.g., is external to the booster circuit 110, and may be replaced by another inductor. In some embodiments, an inductance value of the inductor 102 is used for adjusting, modifying, or determining, the output voltage 115 or is used for adjusting or modifying a ratio of the output voltage 115 to the input voltage 108. In some embodiments, the input voltage 108 is between 2.5 and 4.55 volts and the output voltage 115 is between 4.7 and 5.6 volts, e.g., larger than the input voltage, and the output current is between 100 mA and 200 mA. In some embodiments, the input voltage 108 is 2.5 volts and the output voltage 115 is either 4.7 volts or 5.6 volts. As shown, the system 100 further includes a photo detector 112 that is coupled between a detector 130 and the ground 133. The photo detector 112 is used to detect a light produced by the LED 106 after passing through a sample (not shown). In some embodiments, the voltage and the current of the LED 106 is controlled such that two or more current pulses are sent through the LED 106. In some embodiments, the current in the LED includes a pulse that increases to a positive level and then comes back to zero, e.g., the pulse returns to zero and the current of the LED is a return to zero (RZ) current.

As shown, the booster circuit 110 provides the input voltage 108 and the output voltage 115 to the second device 134. In some embodiments, the second device 134 is an electronic circuit that uses the input voltage 108 and/or the output voltage 115 to determine a second threshold level, e.g., a second PFM threshold level, at an output of the electronic circuit and, thus, the second device 134 does not need digitization and the second threshold value would instantly be available and can change without delay. In some embodiments, as shown, the first threshold level is sent via a first threshold signal 144 and the second threshold level is sent via a second threshold signal 146 to a selector device 136. The selector device 136 also receives a selection signal 142, e.g., a selection voltage. As shown, based on the selection signal 142, the selector device 136 selects one of the first threshold level or the second threshold level and sends a selected threshold signal 145 to the booster circuit 110 to be used by the booster circuit. In some embodiments, the selection signal 142 is predetermined, or is set by a user, or is a time-based setting such that at the initial power up until a predetermined amount of time the second threshold level is used and after that the first threshold level is used. In some embodiments, because the second threshold level reacts instantly to the booster circuit 110 changes, the second threshold level is always used. In some embodiments, when, e.g., in response to, the selection voltage being a positive voltage, the first threshold level is used and when the selection voltages in zero or a negative voltage, the second threshold level is used. In some embodiments, the first threshold level is the same voltage value for the entire range of the input voltage 108 and the output voltage 115. Also, the second threshold level is the same voltage value for the entire range of the input voltage 108 and the output voltage 115. In some embodiments, the second threshold level is between 0.8 and 1.3 volts and the first threshold level is between 0.6 and 1.1 volts.

Figure 2:
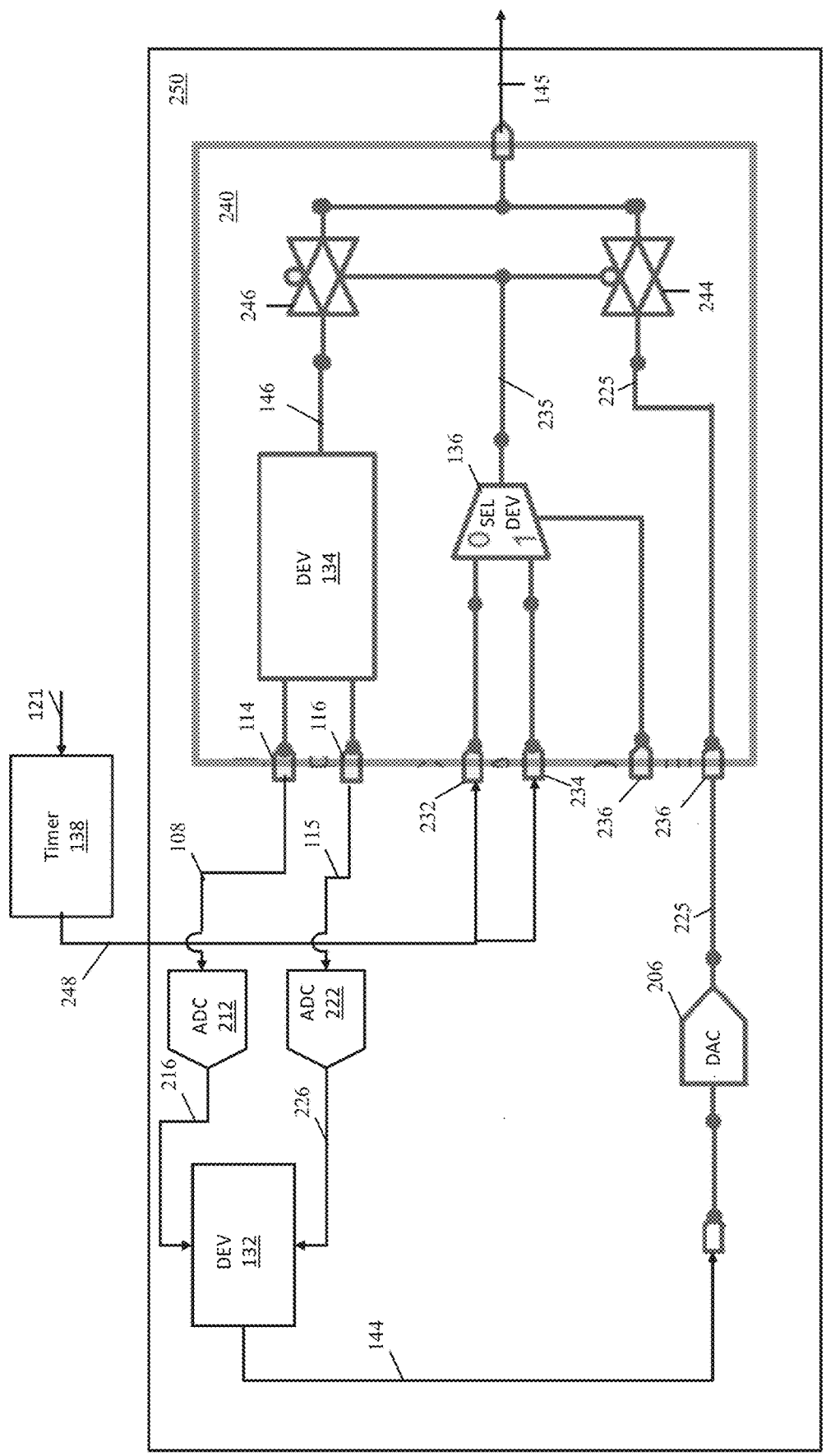
FIG. 2 illustrates a module for generating a PFM threshold level, according to various aspects of the subject technology.

FIG. 2 illustrates a module 250 for generating a PFM threshold level, according to various aspects of the subject technology. FIG. 2 is consistent with FIG. 1 but does not show the booster circuit 110 and only shows the input node 114 and the output node 116 of the booster circuit 110. As shown the input node 114 and the output node 116 are coupled to the first device 132 and the second device 134. The input voltage 108 and the output voltage 115 respectively go through analog to digital converters (ADC) 212 and 222 to produce the digitized input voltage 216 and the digitized output voltage 226. Then the digitized input voltage 216 and the digitized output voltage 226 go to the second device 134. In some embodiments, a digitized signal is generated by quantizing the signal, e.g., an analog signal, and then representing the quantized value of the signal by a number. Thus, the number that represents the quantized value is the digital signal. In some embodiments, the signal is quantized into 8, 16, 24, 32, or 48 quantization levels and the digital signal is represented by a binary signal having 8, 16, 24, 32, or 48 bits respectively. In some embodiments, an ADC is used for generating the digitized signals such that the analog signal is applied to an input of the ADC and output bits of the ADC represent the digital signal. In some embodiments, the digital signals are fed into a processor, e.g., a processor of the first device 132, and the processor used the digital signals to calculate the first threshold level. Consistent with FIG. 1, the first device 132 generates the first threshold level and the second device 134 generates the second threshold level. In some embodiments, unlike the second threshold level, the first threshold level is a digitized value that passes to a digital to analog converter (DAC) 206 to generate a third threshold voltage signal 225. An analog section 240 of the module 250 includes a node 236 for entry of the third threshold voltage signal 225. A node 236 is used for sending the selection signal consistent with the selection signal 142 of FIG. 1 to the selector device 136 of the analog section 240. The analog section 240 includes multiplexers 244 and 246 that selects one of the first threshold level or the third threshold voltage signal 225 based on the selection signal that is sent through the node 236 and generates a signal 235 as the output of the selector device 136 that goes to multiplexers 244 and 246 and based a value of the signal 235 activates one of the multiplexers 244 and 246 to determine the selected threshold level. As shown, the selected threshold level is sent out of the module 250, via the selected threshold signal 145, to be used by the booster circuit 110. In some embodiments, the multiplexers 244 and 246 are analog multiplexers that select one of the second threshold signal 146 or the third threshold voltage signal 225 that are continuous voltage signals. In some embodiments, the third threshold voltage signal 225 is the first threshold signal 144 that is converted to a continuous signal by the DAC 206.

As noted, in some embodiments, the selection is time based. As shown in FIG. 2, the module 250 includes a timer 138. The timer 138 expires, e.g., ends or timeouts, after a predetermined amount of time, e.g., an expiration time of the timer 138. In some embodiments, before the timer expires, the second threshold level is selected and after the timer expires the third threshold voltage signal 225 is selected. As shown an output 248 of the timer 138 is connected via nodes 232 and 234 of analog section 240 to the selector device 136 and make the above-described selection based on time. In some embodiments, the timer 138 receives a triggering signal 121, e.g., a triggering voltage, provided by the booster circuit 110 and in response to the triggering signal 121 the timer 138 starts produces a first voltage at the output 248 of the timer 138. In some embodiments, the triggering signal 121 is a voltage that changes from zero volts to a positive voltage, e.g., a value greater than 1 volt. In some embodiments, in response to the triggering signal 121 changing from zero volts to the positive voltage, the timer 138 starts and provides a low value, e.g., zero volts or a logical-zero at the output 248. In response to the timer 138 expiring, the output 248 changes to a high value, e.g., one volt or a logical-one. In some embodiments, in response to the output 248 of the timer 138 being at the low value, the second threshold level is selected and in response to the output 248 of the timer 138 being at the high value, the first threshold level is selected. In some embodiments, the selection is made via setting the nodes 232 and 234, selector device 136, and the multiplexers 244 and 246. In some embodiments, in response to the triggering signal 121 changing from zero volts to the positive voltage, the timer 138 starts and provides a high value or a logical-one at the output 248. In response to the timer 138 expiring, the output 248 changes to a low value, e.g., zero volts or a logical-zero. In some embodiments, the timer 138 timeouts or expires after a timeout period that is between 10 and 30 seconds. At start up, the booster circuit 110 operates, e.g., functions, in the PFM mode and uses the second threshold level. In some embodiments, If the timer 138 does not timeout and the output voltage 115 reaches the second threshold level, the booster circuit 110 operates in the PWM mode. In some embodiments, if the timer 138 timeouts and the output voltage 115 does not reach the second threshold level, the booster circuit 110 stays in the PFM mode but uses the first threshold level after the timer 138 timeouts. When, e.g., in response to, the output voltage 115 reaches the first threshold level, the booster circuit 110 operates in the PWM mode.

Figures 3A, 3B:
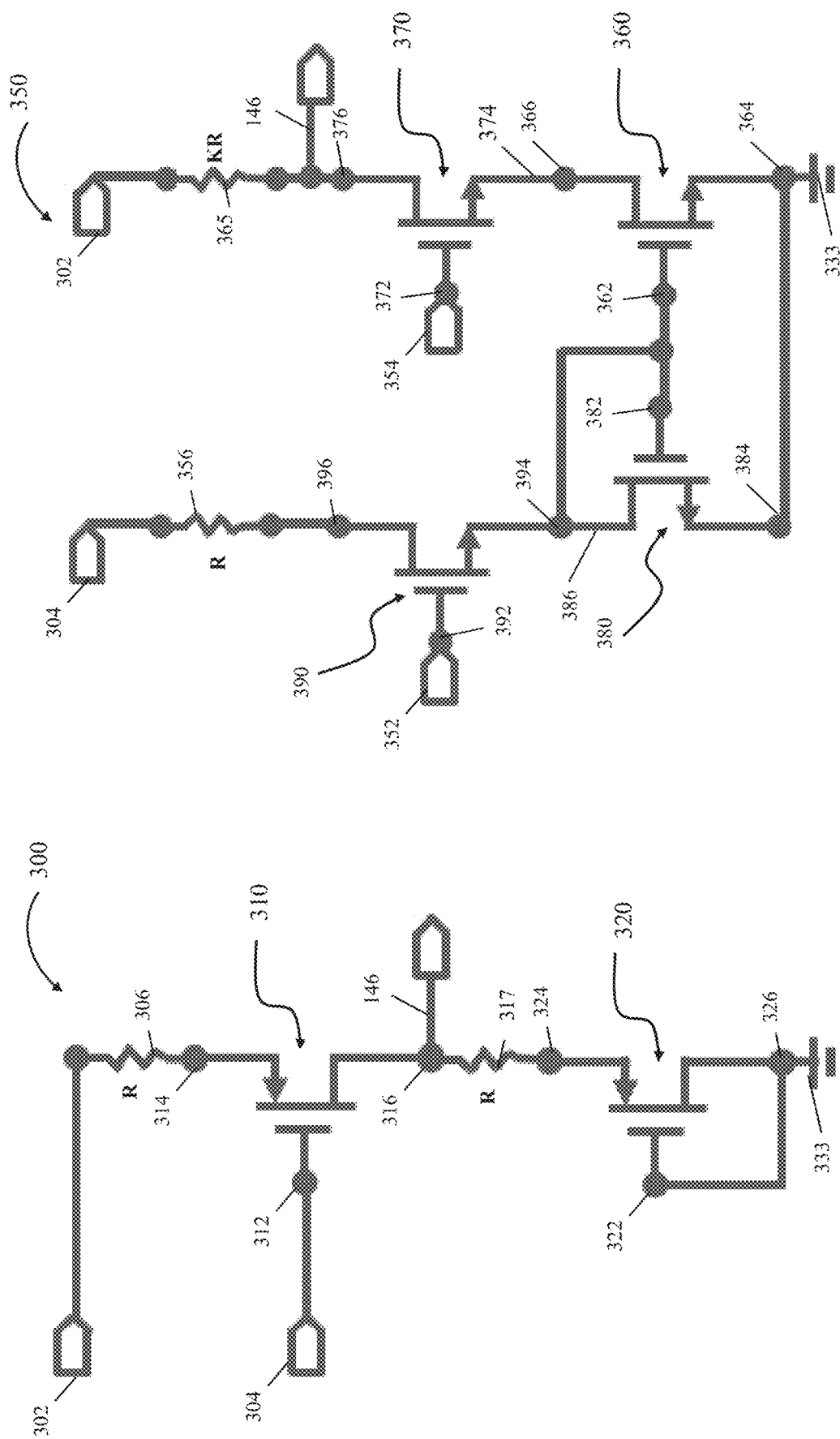
FIGS. 3A and 3B illustrate electronic circuits for generating a PFM threshold level, according to various aspects of the subject technology.

FIGS. 3A and 3B illustrate electronic circuits for generating a PFM threshold level, according to various aspects of the subject technology. A circuit 300 of FIG. 3A shows a reference voltage node 302. In some embodiments, the reference voltage is between about 1.5 volts and 2 volts. In some embodiments, the reference voltage is 1.6 volts. FIG. 3A shows a first resistor 306 and a second resistor 317 of a same value, e.g., having same resistance, and first and second transistors 310 and 320 of a same type, e.g., a first transistor 310 and a second transistor 320 having the same n-type channel or p-type channel, and same parameters, e.g., same transconductance characteristics curves. The first resistor 306 is coupled between the reference voltage node 302 and a first source 314 of the first transistor 310. The second resistor 317 is coupled between a first drain 316 of the first transistor 310 and a second source 324 of the second transistor 320. A first gate 312 of the first transistor 310 is coupled a voltage node 304 having a voltage value proportional, with a ration K, to the input voltage 108. A second gate 322 and a second drain 326 of the second transistor 320 are coupled to a ground 333, and the first drain 316 of the first transistor 310 generates the second threshold level for the booster circuit 110 to operate in the PFM mode. In some embodiments, the generated second threshold level is the reference voltage minus a voltage proportional, with a ratio K, to the input voltage 108 of the booster circuit 110. In some embodiments, two or more transistors of a same type, e.g., developed with same process parameters, have same size, have same dopant density, have same operating parameters, and etc.

In some embodiments, two or more transistors are metal-oxide-semiconductor field-effect transistors (MOSFET). In some embodiments, the two or more transistors have the same type and are either p-channel MOSFETs (PMOS) or are n-channel MOSFETs (NMOS).

A circuit 350 of FIG. 3B shows a reference voltage node 302 and a first resistor 356 and a second resistor 365. A second resistance of the second resistor 365 is proportional, with the ratio K, to a first resistance of the first resistor 356, e.g., having proportional resistance. FIG. 3B shows a first transistor 390 and a second transistor 370 having same type and parameters and a third transistor 380 and a fourth transistor 360 having same type and having same parameters. As shown, the first resistor 356 is coupled between the voltage node 304 and a first drain 396 of the first transistor 390. The second resistor 365 is coupled between the reference voltage node 302 and a second drain 376 of the second transistor 370. A first gate 392 of the first transistor 390 is coupled to an enabler voltage node 352. A second gate 372 of the second transistor 370 is coupled to a selector voltage node 354. A first source 394 of the first transistor 390 is coupled to a third drain 386 of the third transistor 380. A second source 374 of the second transistor 370 is coupled to a fourth drain 366 of the fourth transistor 360. A third source 384 of the third transistor 380 and a fourth source 364 of the fourth transistor 360 are coupled to each other and are coupled to a ground 333. A third gate 382 of the third transistor 380 and a fourth gate 362 of the fourth transistor 360 are coupled to each other and are coupled to the first source 394 of the first transistor. Also, in response to the enabler voltage node 352 and the selector voltage node 354 being set to positive voltages to turn on the first and the second transistor 390 and 370, the second drain 376 of the second transistor 370 is configured to generate the second threshold level for the booster circuit to operate in the PFM mode. In some embodiments, the generated second threshold level is the reference voltage minus a voltage proportional, with a ration K, to the input voltage 108 of the booster circuit 110.

The subject technology discussed above provides alternative methods of determining the PFM threshold level. One method uses digitized voltages of the input and output nodes of a voltage booster circuit of the power supply to calculate the PFM threshold level. This method may not work at start up when the voltages of the input and output nodes of the voltage booster circuit are not digitized yet and gives erroneous results that may cause oscillation or ringing of the output voltage of the voltage booster circuit or the power supply. Another method and examples electronic circuits are introduced above that uses the circuits to determine the PFM threshold level. Thus, the PFM threshold level is determined using the electronic circuits.

According to aspects of the subject technology, a system includes a voltage booster circuit to receive an input voltage and provide an output voltage and a first device coupled to the voltage booster circuit to receive a digitized input voltage and a digitized output voltage and to determine a first threshold level for the voltage booster circuit to operate in a pulse frequency modulation (PFM) mode. The system also includes a second device coupled to the voltage booster circuit to receive the input voltage and the output voltage and determine a second threshold level for the voltage booster circuit to operate in the PFM mode. The system further includes a selector device coupled to the first device and the second device to select one of the first threshold level or the second threshold level for the voltage booster circuit.

In an aspect of the subject technology, the output voltage is larger than the input voltage. In an aspect of the subject technology, the system further includes a first analog to digital converter (ADC) coupled between the voltage booster circuit and the first device to receive the input voltage and to provide the digitized input voltage and a second ADC coupled between the voltage booster circuit and the first device to receive the output voltage and to provide the digitized output voltage. In an aspect of the subject technology, the selector device further includes a selection signal and the selector device selects one of the first threshold level or the second threshold level, based on the selection signal. In an aspect of the subject technology, the system further includes a timer coupled to the selector device to provide the selection signal such that the selection signal is set to select the second threshold level before the timer expires and the selection signal is set to select the first threshold level in response to the timer expiring. In an aspect of the subject technology, the system further includes a capacitor coupled between an output node of the voltage booster circuit and a ground and the capacitor is configured to reduce fluctuations of the output voltage. In an aspect of the subject technology, the input voltage is between 2 and 3 volts and the output voltage is between 4.5 and 6 volts.

According to aspects of the subject technology, a system includes a first device to receive an input voltage of a circuit via a first analog to digital converter (ADC). The first device also provides a digitized input voltage and receives an output voltage of the circuit via a second ADC that provides a digitized output voltage. The first device determines a first threshold level for the circuit to operate in a pulse frequency modulation (PFM) mode based on the digitized input voltage and the digitized output voltage. The system also includes a second device to receive the input voltage and the output voltage and to determine a second threshold level for the circuit to operate in the PFM mode based on the input voltage and the output voltage. The system further includes a timer to receive the first threshold level and the second threshold level and to select, based on an expiration time of the timer, one of the first threshold level or the second threshold level for the circuit such that before the timer expires, the second threshold level is selected, and in response to the timer expiring, the first threshold level is selected.

In an aspect of the subject technology, the input voltage is between 2 and 3 volts and the output voltage is between 4.5 and 6 volts, and the booster output current is between 100 milliamperes (mA) and 200 mA. In an aspect of the subject technology, the system further includes a battery coupled to the circuit to provide the input voltage. In an aspect of the subject technology, the system further includes a voltage regulator coupled to an output port of the circuit and configured to remove fluctuations of the output voltage. In an aspect of the subject technology, the system further includes a capacitor coupled to the output port of the circuit and to an input port of the voltage regulator to remove the fluctuations of the output voltage. In an aspect of the subject technology, the system further includes an inductor coupled to the circuit such that the inductor is external to the circuit and a ratio of the output voltage to the input voltage is adjusted by the inductor. In an aspect of the subject technology, the second device includes a reference voltage, first and second resistors of a same value, and first and second transistors of a same type and same parameters. The first resistor is coupled between the reference voltage and a first source of the first transistor and the second resistor is coupled between a first drain of the first transistor and a second source of the second transistor. A first gate of the first transistor is coupled a voltage proportional to the output voltage, a second gate and a second drain of the second transistor are coupled to a ground, and the first drain of the first transistor generates the second threshold level for the booster circuit to operate in the PFM mode.

According to aspects of the subject technology, a system includes a booster circuit to receive an input voltage and provide an output voltage greater than the input voltage. The system includes an input node to receive a first threshold level for the booster circuit to operate in a pulse frequency modulation (PFM) mode. The system also includes a second device coupled to the booster circuit to receive the input voltage and the output voltage and to determine a second threshold level for the booster circuit to operate in the PFM mode. The system further includes a selector device to receive the first threshold level and the second threshold level and to select one of the first threshold level or the second threshold level for the booster circuit.

In an aspect of the subject technology, the system further includes a first device coupled to the booster circuit to receive the input voltage via a first analog to digital converter (ADC) and to receive the output voltage via a second ADC and to determine the first threshold level. In an aspect of the subject technology, the second device includes a reference voltage source, a first resistor and a second resistor such that a second resistance of the second resistor is proportional, with a first ratio, to a first resistance of the first resistor. The second device includes a first transistor and a second transistor having same type and same parameters and a third transistor and a fourth transistor having same type and same parameters. The first resistor is coupled between the input voltage and a first drain of the first transistor, the second resistor is coupled between the reference voltage and a second drain of the second transistor, a first gate of the first transistor is coupled to an enabler voltage node, a second gate of the second transistor is coupled to a selector voltage node, a first source of the first transistor is coupled to a third drain of the third transistor, a second source of the second transistor is coupled to a fourth drain of the fourth transistor, a third source of the third transistor and a fourth source of the fourth transistor are coupled to each other and are coupled to a ground, a third gate of the third transistor and a fourth gate of the fourth transistor are coupled to each other and are coupled to the first source of the first transistor, and in response to the enabler voltage node and the selector voltage node are being set to positive voltages to turn on the first and the second transistor, the second drain of the second transistor generates the second threshold level for the booster circuit to operate in the PFM mode. In an aspect of the subject technology, the system further includes a capacitor coupled to an output port of the booster circuit to reduce fluctuations of the output voltage. In an aspect of the subject technology, the input voltage is 2.5 volts and the output voltage is either 4.7 volts or 5.6 volts. In an aspect of the subject technology, the selector device further includes a selection signal such that the selector device selects one of the first threshold level or the second threshold level based on the selection signal.

Those of skill in the art would appreciate that the various illustrative blocks, modules, elements, components, memory systems, and algorithms described herein may be implemented as electronic hardware, computer software, or combinations of both. To illustrate this interchangeability of hardware and software, various illustrative blocks, modules, elements, components, memory systems, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks should be performed. Any of the blocks may be simultaneously performed. In one or more implementations, multitasking and parallel processing may be advantageous. Moreover, the separation of various system components in the embodiments described above should not be understood as requiring such separation in all embodiments, and it should be understood that the described program components and systems could generally be integrated together in a single software product or packaged into multiple software products.

As used in this specification and any claims of this application, the terms "base station," "receiver," "computer," "server," "processor," and "memory" all refer to electronic or other technological devices. These terms exclude people or groups of people. For the purposes of the specification, the term "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" and "at least one of A, B, or C" each refer to only A, only B, or only C; any combination of A, B, and C; and/or at least one of each of A, B, and C.

The predicate words "configured to," "operable to," and "programmed to" do not imply any particular tangible or intangible modification of a subject but rather are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Phrases such as "an aspect," "the aspect," "another aspect," "some aspects," "one or" "some more aspects," "an implementation," "the implementation," "another implementation," "implementations," "one or more implementations," "an embodiment," "the embodiment," "another embodiment," "some embodiments," "one or more embodiments," "a configuration," "the configuration," "another configuration," "some configurations," "one or more configurations," "the subject technology," "the disclosure," "the present disclosure," and other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as "an aspect" or "some aspects" may refer to one or more aspects and vice versa, and this applies similarly to other foregoing phrases.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skilled in the art are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a memory system claim, the element is recited using the phrase "step for."

The previous description is provided to enable any person skilled in the art to practice the various aspects described herein. Various modifications to these aspects would be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A system, comprising:
   a circuit configured to receive an input voltage and provide an output voltage;
   a first device coupled to the circuit and configured to:
      receive a digitized input voltage and a digitized output voltage, and
      determine, based on the digitized input voltage and the digitized output voltage, a first threshold level for the circuit to operate in a pulse frequency modulation (PFM) mode;
   a second device coupled to the circuit and configured to:
      receive the input voltage and the output voltage, and
      determine a second threshold level for the circuit to operate in the PFM mode; and
   a selector device coupled to the first device and the second device and configured to select one of the first threshold level or the second threshold level for the circuit.

2. The system of claim 1, wherein the output voltage is larger than the input voltage.

3. The system of claim 1, further comprising:
   a first analog to digital converter (ADC) coupled between the circuit and the first device and configured to receive the input voltage and to provide the digitized input voltage; and
   a second ADC coupled between the circuit and the first device and configured to receive the output voltage and to provide the digitized output voltage.

4. The system of claim 1, wherein the selector device is configured to receive a selection signal, wherein the selector device is configured to select one of the first threshold level or the second threshold level, based on the selection signal.

5. The system of claim 4, further comprising:
   a timer coupled to the selector device and configured to provide the selection signal, wherein before the timer expires, the selection signal is set to select the second threshold level, and wherein in response to the timer expiring, the selection signal is set to select the first threshold level.

6. The system of claim 1, further comprising:
   a capacitor coupled between an output node of the circuit and a ground, wherein the capacitor is configured to reduce fluctuations of the output voltage.

7. The system of claim 1, wherein the input voltage is between 2.5 and 4.55 volts and the output voltage is between 4.7 and 5.6 volts.

8. A system, comprising:
   a first device configured to receive an input voltage of a circuit via a first analog to digital converter (ADC), configured to provide a digitized input voltage, and to receive an output voltage of the circuit via a second ADC, configured to provide a digitized output voltage, and to determine a first threshold level for the circuit to operate in a pulse frequency modulation (PFM) mode based on the digitized input voltage and the digitized output voltage;
a second device configured to receive the input voltage and the output voltage and to determine a second threshold level for the circuit to operate in the PFM mode based on the input voltage and the output voltage; and
a timer configured to receive the first threshold level and the second threshold level and to select, based on an expiration time of the timer, one of the first threshold level or the second threshold level for the circuit, wherein before the timer expires, the second threshold level is selected, and wherein in response to the timer expiring, the first threshold level is selected.

9. The system of claim 8, wherein the input voltage is between 2 and 3 volts and the output voltage is between 4.5 and 6 volts, and wherein an output current of the circuit is between 100 milliamperes (mA) and 200 mA.

10. The system of claim 8, further comprising:
a battery coupled to the circuit to provide the input voltage.

11. The system of claim 8, further comprising:
a voltage regulator coupled to an output port of the circuit and configured to remove fluctuations of the output voltage.

12. The system of claim 11, further comprising:
a capacitor coupled to the output port of the circuit and to an input port of the voltage regulator and configured to remove the fluctuations of the output voltage.

13. The system of claim 8, further comprising:
an inductor coupled to the circuit, wherein the inductor is external to the circuit, and wherein an inductance value of the inductor is configured to determine a ratio of the output voltage to the input voltage.

14. The system of claim 8, wherein the second device comprises:
a reference voltage node;
first and second resistors of a same value; and
first and second transistors of a same type, wherein:
    the first resistor is coupled between the reference voltage node and a first source of the first transistor,
    the second resistor is coupled between a first drain of the first transistor and a second source of the second transistor,
    a first gate of the first transistor is coupled to a voltage node having a voltage proportional to the output voltage,
    a second gate and a second drain of the second transistor are coupled to a ground, and
    the first drain of the first transistor is configured to generate the second threshold level for the circuit to operate in the PFM mode.

15. A system, comprising:
a booster circuit configured to receive an input voltage and to provide an output voltage greater than the input voltage;
an input node configured to receive a first threshold level for the booster circuit to operate in a pulse frequency modulation (PFM) mode;
a second device coupled to the booster circuit and configured to receive the input voltage and the output voltage and determine a second threshold level for the booster circuit to operate in the PFM mode; and
a selector device configured to receive the first threshold level and the second threshold level and configured to select one of the first threshold level or the second threshold level for the booster circuit.

16. The system of claim 15, further comprising:
a first device coupled to the booster circuit and configured to receive the input voltage via a first analog to digital converter (ADC) and to receive the output voltage via a second ADC and to determine the first threshold level.

17. The system of claim 16, wherein the second device comprises:
a reference voltage node;
a first resistor and a second resistor, wherein a second resistance of the second resistor is proportional, with a first ratio, to a first resistance of the first resistor;
a first transistor and a second transistor having a same type and having same parameters; and
a third transistor and a fourth transistor having a same type and having same parameters, wherein:
    the first resistor is coupled between the input voltage and a first drain of the first transistor,
    the second resistor is coupled between the reference voltage node and a second drain of the second transistor,
    a first gate of the first transistor is coupled to an enabler voltage node,
    a second gate of the second transistor is coupled to a selector voltage node,
    a first source of the first transistor is coupled to a third drain of the third transistor,
    a second source of the second transistor is coupled to a fourth drain of the fourth transistor,
    a third source of the third transistor and a fourth source of the fourth transistor are coupled to each other and are coupled to a ground,
    a third gate of the third transistor and a fourth gate of the fourth transistor are coupled to each other and are coupled to the first source of the first transistor, and
    in response to the enabler voltage node and the selector voltage node are being set to positive voltages to turn on the first and the second transistor, the second drain of the second transistor is configured to generate the second threshold level for the booster circuit to operate in the PFM mode.

18. The system of claim 15, further comprising:
a capacitor coupled to an output port of the booster circuit to reduce fluctuations of the output voltage.

19. The system of claim 15, wherein the input voltage is 2.5 volts and the output voltage is either 4.7 volts or 5.6 volts.

20. The system of claim 15, wherein the selector device further comprises a selection signal, wherein the selector device is configured to select one of the first threshold level or the second threshold level based on the selection signal.

* * * * *